(12) United States Patent
Koo

(10) Patent No.: US 7,423,920 B2
(45) Date of Patent: Sep. 9, 2008

(54) SEMICONDUCTOR DEVICE

(75) Inventor: Kie Bong Koo, Cheongju-Si (KR)

(73) Assignee: Hynix Semiconductor Inc., Gyunggi-do (KR)

(*) Notice: Subject to any disclaimer, the term of this patent is extended or adjusted under 35 U.S.C. 154(b) by 233 days.

(21) Appl. No.: 11/458,227

(22) Filed: Jul. 18, 2006

(65) Prior Publication Data
US 2007/0080717 A1    Apr. 12, 2007

(30) Foreign Application Priority Data
Oct. 12, 2005    (KR) .................. 10-2005-0096254

(51) Int. Cl.
*G11C 7/00* (2006.01)
(52) U.S. Cl. ............ 365/194; 365/189.05; 365/189.011
(58) Field of Classification Search .......... 365/194, 365/189.05, 189.011
See application file for complete search history.

(56) References Cited

U.S. PATENT DOCUMENTS

| 5,977,798 | A | 11/1999 | Zerbe |
| 6,031,775 | A | 2/2000 | Chang et al. |
| 6,549,470 | B2 | 4/2003 | Hardee et al. |
| 6,687,181 | B2* | 2/2004 | Usuki et al. ............. 365/230.03 |
| 6,781,421 | B2 | 8/2004 | Terzioglu et al. |
| 6,930,941 | B2 | 8/2005 | Nakase |
| 7,005,892 | B2 | 2/2006 | Afghahi et al. |

FOREIGN PATENT DOCUMENTS

| JP | 2000-200488 | 7/2000 |
| KP | 10-2005-0063306 | 6/2005 |
| KP | 10-2005-0067448 | 7/2005 |

* cited by examiner

*Primary Examiner*—Richard T. Elms
*Assistant Examiner*—Nam Nguyen
(74) *Attorney, Agent, or Firm*—Marshall, Gerstein & Borun LLP

(57) ABSTRACT

A semiconductor device is disclosed which increases the data transfer rate in transferring data output from an input/output sense amplifier via a global data bus line by reducing the swing width of the data placed on the global data bus line. The semiconductor device may include a data transfer unit which receives first data, and outputs second data obtained by driving the first data to a predetermined level to a data transfer line; a data receiver which receives the second data transferred via the data transfer line; a delay which outputs a plurality of delay signals respectively obtained by delaying the second data outputted from the data transfer unit by different delay periods; a delay controller which selects one of the delay signals in accordance with an operation mode of the semiconductor device, and outputs at least one adjustment signal for adjusting a driving period of the data transfer unit for the first data based on the delay period of the selected delay signal; and a transfer controller which receives the first data and the at least one adjustment signal, and outputs at least one transfer control signal for controlling the operation of the data transfer unit, based on the received first data and adjustment signal.

34 Claims, 5 Drawing Sheets

US 7,423,920 B2

SEMICONDUCTOR DEVICE

TECHNICAL FIELD

This patent relates to a semiconductor device, and, more particularly, to a semiconductor device which increases the data transfer rate in transferring data output from an input/output sense amplifier via a global data bus line by reducing the swing width of the data placed on the global data bus line, thereby achieving an enhancement in high-frequency operation characteristics.

DESCRIPTION OF THE RELATED ART

Dynamic random access memories (DRAMs) are well known as a volatile memory device which includes cells each having one transistor and one capacitor to store data. Basic functions of such a DRAM, namely, data inputting/outputting operations, are carried out in accordance with ON/OFF of word lines connected to the gates of transistors in the cells of the DRAM.

In a general DRAM memory device, its memory cell array is divided into a plurality of banks. Reading data stored in each cell is achieved in accordance with operations of driving cell data, amplified by an input/output (I/O) sense amplifier, by a data transfer unit functioning as a driver, to transfer the data on a global data bus line, transferring the data to a data receiver via the global data bus line, and outputting the data via an output terminal.

FIG. 1 is a circuit diagram explaining a conventional method for transferring data via a global data bus line in a semiconductor device. As shown in the drawing, in the conventional semiconductor device, data MA_DATA amplified by an I/O sense amplifier is input to a data transfer unit 110. The data transfer unit 110 functions as a driver. That is, the data transfer unit 11 0 drives the data MA_DATA, applied thereto, to a predetermined level, in order to transfer the data MA_DATA to a data receiver 120 via a global data bus line.

In the conventional semiconductor device, the data placed on the global data bus line is swung between an external voltage VDD and a ground voltage VSS. However, where the global data bus line is constituted by equivalent resistors, capacitors, etc, so that the load of the global data bus line is large. there is a problem in that a significant increase in data access time occurs when the data transferred via the global data bus line is fully swung between the external voltage and the ground voltage, as mentioned above, namely. when the swing width of the data is large. Such an increase in data transition time causes an increase in data access time, and thus, a degradation in high-frequency operation characteristics. In addition, even when data on a node (A) in FIG. 1 is not fully swung between the external voltage VDD and the ground voltage VSS, the data has a certain level biased toward the external voltage VDD in the conventional case, as shown in FIG. 2. For this reason, the data receiver 120 may incorrectly sense the low level of data, so that data errors may occur.

SUMMARY OF THE INVENTION

A semiconductor device increases the data transfer rate in transferring data output from an input/output sense amplifier via a global data bus line by reducing the swing width of the data placed on the global data bus line, thereby achieving an enhancement in high-frequency operation characteristics while suppressing generation of data errors.

A semiconductor device may include a data transfer unit which receives first data, and outputs second data obtained by driving the first data to a predetermined level to a data transfer line; a data receiver which receives the second data transferred via the data transfer line; a delay which outputs a plurality of delay signals respectively obtained by delaying the second data outputted from the data transfer unit by different delay periods; a delay controller which selects one of the delay signals in accordance with an operation mode of the semiconductor device, and outputs at least one adjustment signal for adjusting a driving period of the data transfer unit for the first data based on the delay period of the selected delay signal; and a transfer controller which receives the first data and the at least one adjustment signal, and outputs at least one transfer control signal for controlling the operation of the data transfer unit, based on the received first data and adjustment signal.

The data transfer unit may include: a first logic unit which logically operates a first one of the at least one transfer control signal and the first data, and outputs the result of the logical operation; a pull-up unit which pulls up an output terminal of the data transfer unit in response to an output signal from the first logic unit; a second logic unit which logically operates a second one of the at least one transfer control signal and the first data, and outputs the result of the logical operation; and a pull-down unit which pulls down the output terminal of the data transfer unit in response to an output signal from the second logic unit.

The first logic unit may execute a NANDing operation, and the second logic unit may execute a NORing operation.

The data receiver may include at least one driver which drives the second data to a predetermined level, and outputs the resultant data.

The semiconductor device may further comprise a data sensor which senses a level of the second data output from the data transfer unit, drives the second data to a predetermined level, based on the sensed second data level, and supplies the result of the driving to the delay.

The data sensor may include a plurality of buffers which buffer the second data.

The delay controller may include: a first logic unit which logically operates a first one of the delay signals and an inverted signal of an operation mode signal representing an operation mode of the semiconductor device, and outputs the result of the logical operation; a second logic unit which logically operates a second one of the delay signals and the operation mode signal, and outputs the result of the logical operation; a third logic unit which logically operates an output signal from the first logic unit and an output signal from the second logic unit; and a fourth logic unit which logically operates the output signal from the first logic unit and the output signal from the second logic unit.

The delay controller may further include: a fifth logic unit which logically operates an output signal from the third logic unit and a reset signal, and outputs the result of the logical operation as a first one of the at least one adjustment signal; and a sixth logic unit which logically operates an output signal from the fourth logic unit and an inverted signal of the reset signal, and outputs the result of the logical operation as a second one of the at least one adjustment signal.

The fifth logic unit may execute a NORing operation, and the sixth logic unit may execute a NANDing operation.

Each of the first and second logic units may execute an ANDing operation.

Each of the third and fourth logic units may execute a NANDing operation.

The operation mode signal may be used to determine whether the semiconductor device in a normal operation mode or in a test mode.

The transfer controller may include a first transfer control signal generator which includes a first pull-up unit for pulling up a first node in response to the first data, a first logic unit for logically operating a first one of the at least one adjustment signal and the first data, a first buffer for buffering an output signal from the first logic unit, and a first pull-down unit for pulling down the first node in response to an output signal from the first buffer.

The first logic unit may execute a NANDing operation.

The first transfer control signal generator may further include a latch for latching a signal on the first node for a predetermined period.

The transfer controller may further include a second transfer control signal generator which includes a second logic unit for logically operating a second one of the at least one adjustment signal and the first data, a second buffer for buffering an output signal from the second logic unit, a second pull-up unit for pulling up a second node in response to an output signal from the second buffer, and a second pull-down unit for pulling down the second node in response to the first data.

The second logic unit may execute a NORing operation.

The second transfer control signal generator may further include a latch for latching a signal on the second node for a predetermined period.

The delay controller may select one of the delay signals in accordance with whether the semiconductor device is in a normal operation mode or in a test mode.

The first data may be a signal output from an input/output sense amplifier.

The data transfer line may be a global data bus line.

A semiconductor device may include a data transfer unit which receives first data, and outputs second data obtained by driving the first data to a predetermined level to a data transfer line; a data receiver which receives the second data transferred via the data transfer line; a delay which outputs a delay signal obtained by delaying the second data outputted from the data transfer unit by a predetermined delay period; a delay controller which receives the first data and the delay signal from the delay, and outputs a first transfer control signal and a second transfer control signal for controlling the data transfer unit to adjust a driving period of the first data in accordance with the delay period of the delay signal.

The data transfer unit may include: a first logic unit which logically operates the first data and the first transfer control signal, and outputs the result of the logical operation; a pull-up unit which pulls up an output terminal of the data transfer unit in response to an output signal from the first logic unit; a second logic unit which logically operates the first data and the second transfer control signal, and outputs the result of the logical operation; and a pull-down unit which pulls down the output terminal of the data transfer unit in response to an output signal from the second logic unit.

The first logic unit may execute a NANDing operation, and the second logic unit may execute a NORing operation.

The semiconductor device may further comprise a data sensor which senses a level of the second data output from the data transfer unit, drives the second data to a predetermined level, based on the sensed second data level, and supplies the result of the driving to the delay.

The data sensor may include a plurality of buffers which buffer the second data.

The predetermined delay period of the delay may be set by different delay periods for a normal operation mode of the semiconductor device and a test mode of the semiconductor device, respectively.

The transfer controller may include a first transfer control signal generator which includes a first pull-up unit for pulling up a first node in response to the first data, a first logic unit for logically operating the first data and the delay signal from the delay, a first buffer for buffering an output signal from the first logic unit, and a first pull-down unit for pulling down the first node in response to an output signal from the first buffer.

The first logic unit may execute a NANDing operation.

The first transfer control signal generator may further include a latch for latching a signal on the first node for a predetermined period.

The transfer controller may further include a second transfer control signal generator which includes a second logic unit for logically operating the first data and the delay signal from the delay, a second buffer for buffering an output signal from the second logic unit, a second pull-up unit for pulling up a second node in response to an output signal from the second buffer, and a second pull-down unit for pulling down the second node in response to the first data.

The second logic unit may execute a NORing operation.

The second transfer control signal generator may further include a latch for latching a signal on the second node for a predetermined period.

The first data may be a signal output from an input/output sense amplifier, and the data transfer line is a global data bus line

BRIEF DESCRIPTION OF THE DRAWINGS

The above features and advantages will become more apparent after reading the following detailed description when taken in conjunction with the drawings, in which.

DETAILED DESCRIPTION

Hereinafter, the various exemplary embodiments are described. These embodiments are used only for illustrative purposes, and the present invention is not limited thereto.

Figure 4:
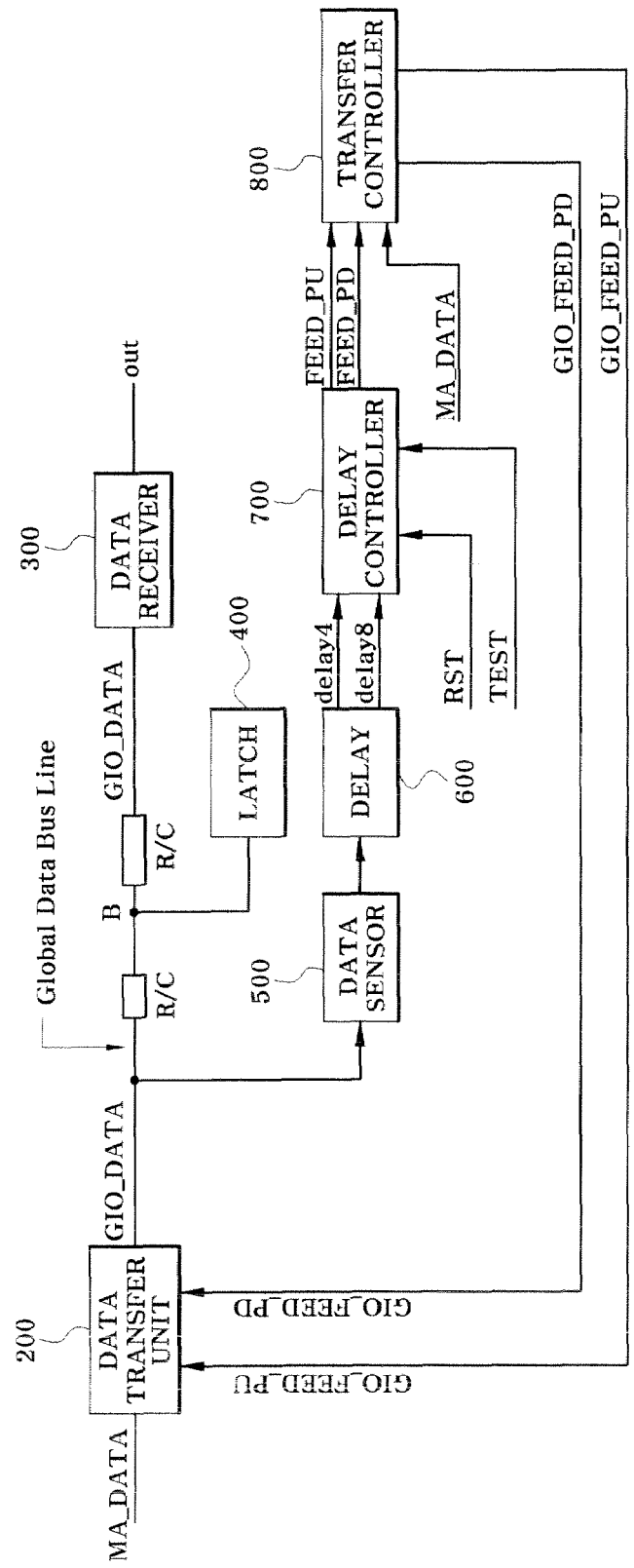
FIG. 4 is a block diagram illustrating a configuration of a semiconductor device according to an exemplary embodiment.

FIG. 4 illustrates a configuration of a semiconductor device according to an exemplary embodiment. FIGS. 5 to 8 illustrate configurations of constituent elements of the semiconductor device according to the exemplary embodiment.

Figure 5:
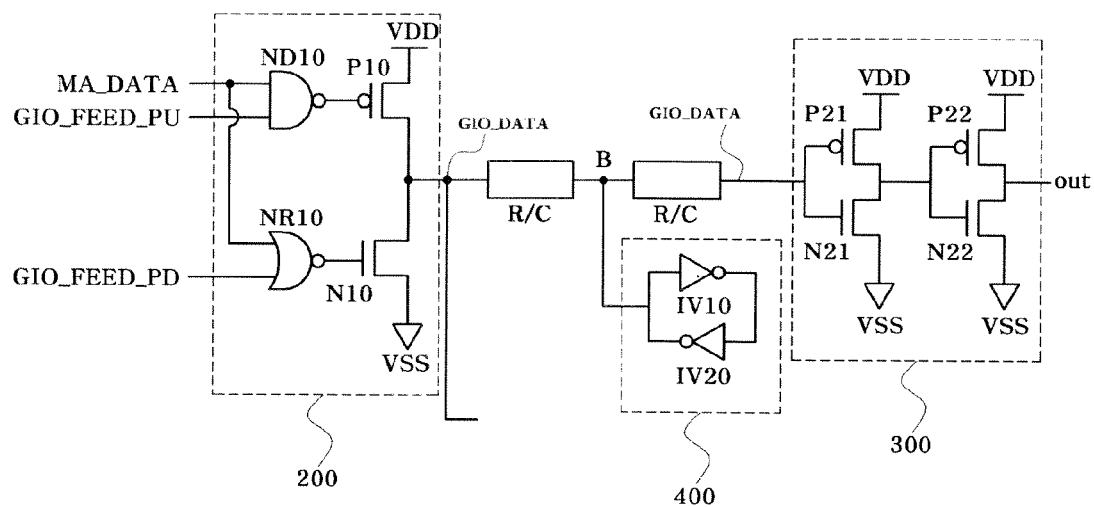
FIG. 5 is a circuit diagram illustrating configurations of a data transfer unit and a data receiver included in the semiconductor device according to the exemplary embodiment.

As shown in FIG. 5, the semiconductor device according to the exemplary embodiment includes a data transfer unit 200 which receives data MA_DATA output from an input/output (I/O) sense amplifier, and outputs data GIO_DATA, obtained after driving the data MA_DATA to a predetermined level, to a global data bus line, a data receiver 30 which receives the data GIO_DATA transferred via the global data bus line, and a delay 600 which outputs delay signals delay4 and delay8 respectively obtained after delaying the data GIO_DATA output from the data transfer unit 200 for predetermined delay periods. The semiconductor device also includes a delay controller 700 which selects one of the delay signals delay4 and delay8, and outputs adjustment signals FEED_PU and FEED_PD for adjusting the driving period of the data transfer unit 200 for the data MA_DATA, based on the delay period of the selected delay signal delay4 or delay8, and a transfer controller 800 which receives the data MA_DATA and adjustment signals FEED_PU and FEED_PD, and outputs transfer control signals GIO_FEED_PD and GIO_FEED_PU for controlling the operation of the data transfer unit 200, based on the received data and signals.

As shown in FIG. 5, the data transfer unit 200 includes a NAND gate ND1O which NANDs the data MA_DATA and transfer control signal GIO_FEED_PU, and outputs a signal representing the result of the NANDing operation, and a PMOS transistor P10 which pulls up an output terminal of the data transfer unit 200 in response to the output signal from the NAND gate ND10. The data transfer unit 200 also includes a NOR gate NR1O which NORs the data MA_DATA and transfer control signal GIO_FEED_PD, and outputs a signal representing the result of the NORing operation, and an NMOS transistor N10 which pull downs the output terminal of the data transfer unit 200 in response to the output signal from the NOR gate NR10.

Figure 7:
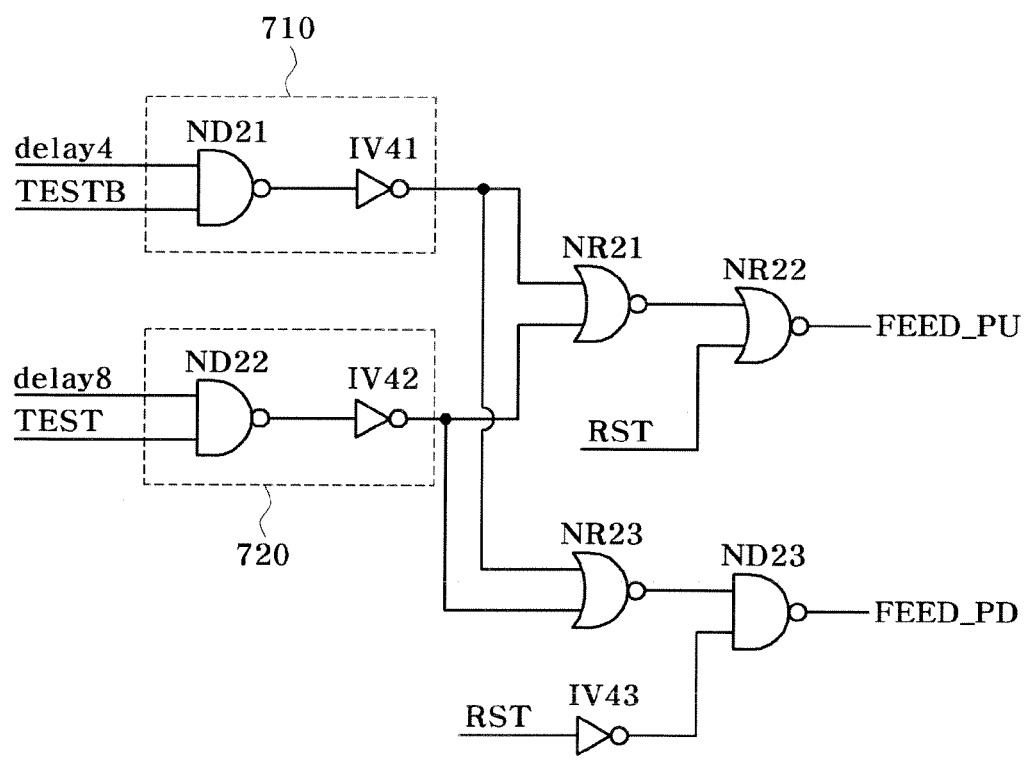
FIG. 7 is a circuit diagram illustrating a configurations of a delay controller included in the semiconductor device according to the exemplary embodiment.

As shown in FIG. 7, the delay controller 700 includes a logic unit 710 which ANDs the delay signal delay4 and an inverted signal of a test mode signal TEST, namely, a signal TESTB, and outputs a signal representing the result of the ANDing operation, and a logic unit 720 which ANDs the delay signal delay8 and test mode signal TEST, and outputs a signal representing the result of the ANDing operation. The delay controller 700 also includes a NOR gate NR21 which NORs the output signals from the logic units 710 and 720, a NOR gate NR23 which NORs the output signals from the logic units 710 and 720, a NOR gate NR22 which NORs an output signal from the NOR gate NR21 and a reset signal RST, and outputs the result of the NORing operation as the adjustment signal FEED_PU, and a NAND gate ND23 which NANDs an output signal from the NOR gate NR23 and an inverted signal of the reset signal RST, and outputs the result of the NANDing operation as the adjustment signal FEED_PD.

Figure 8:
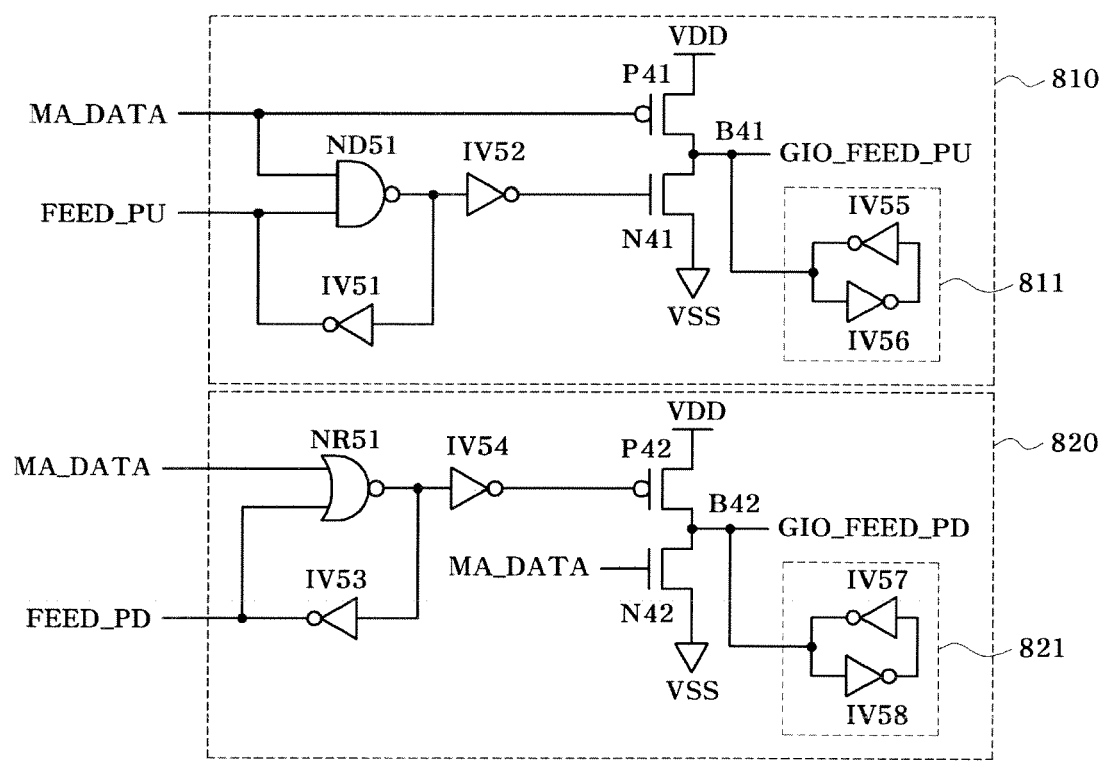
FIG. 8 is a circuit diagram illustrating a configurations of a transfer controller included in the semiconductor device according to the exemplary embodiment.

As shown in FIG. 8, the transfer controller udes a first transfer control signal generator a second transfer control signal generator 820. The first transfer control signal generator 810 includes a PMOS transistor P41 which pulls up a node B41 in response to the data MA_DATA, a NAND gate ND51 which NANDs the data MA_DATA and adjustment signal FEED_PU, an inverter IV52 which inversely buffers an output signal from the NAND gate ND5 1, and an NMOS transistor N41 which pulls down the node B41 in response to an output signal from the inverter IV52. The second transfer control signal generator 820 includes a NOR gate NR51 which NORs the data MA_DATA and adjustment signal FEED_PD, an inverter IV54 which inversely buffers an output signal from the NOR gate NR51, a PMOS transistor P42 which pulls up a node B42 in response to an output signal from the inverter IV54, and an NMOS transistor N42 which pulls down the node B42 in response to the data MA_DATA.

Operation of the semiconductor device having the above-described configuration according to the exemplary embodiment will be described in detail with reference to FIGS. 4 to 8.

When data MA_DATA is transferred from an I/O sense amplifier (not shown), as shown in FIG. 4, the data transfer unit 200 receives the data MA_DATA, drives the data MA_DATA to a predetermined level, and outputs the resultant data to the global data bus line. Here, the data MA_DATA is obtained by reading data stored in a cell in accordance with a read command, amplifying by a bit line sense amplifier, and then re-amplifying by the I/O sense amplifier. Hereinafter, operations of the data transfer unit 200 and remaining constituent elements will be described.

In an initial state, the adjustment signal FEED_PU has a low level, and the adjustment signal FEED_PD has a high level because a reset signal RST, which has a high level, is applied to the delay controller 700 of FIG. 7. In the first transfer control signal generator 810 shown in FIG. 8, accordingly, the NAND gate ND51 outputs a high-level signal, so that the NMOS transistor N41 is turned off in response to a low-level signal output from the inverter IV52. The PMOS transistor P41 is turned on when the data MA_DATA has a low level. In this state, the PMOS transistor P41 drives the node B41 to a high level. Subsequently, the transfer control signal GIO_FEED_PU is maintained in a high-level state in accordance with operation of a latch 811 connected to the node B41. Meanwhile, in the second transfer control signal generator 820, the NOR gate NR51 outputs a low-level signal, so that the PMOS transistor P42 is turned off in response to a high-level signal output from the inverter IV54. The NMOS transistor N42 is turned on when the data MA_DATA has a high level. In this state, the NMOS transistor N42 drives the node B42 to a low level. Subsequently, the transfer control signal GIO_FEED_PD is maintained in a low-level state in accordance with operation of a latch 821 connected to the node B41.

When the reset signal RST is transited to a low level, and the data MA_DATA is transited from a low level to a high level, the PMOS transistor P41 and NMOS transistor N41 in the transfer controller 800 of FIG. 8 are turned off. However, in this state, the transfer control signal GIO_FEED_PU is maintained in a high-level state in accordance with operation of the latch 811. Also, the transfer control signal GIO_FEED_PD is maintained in a low-level state because the PMOS transistor P42 is maintained in an OFF state, and the NMOS transistor N42 is maintained in an ON state.

In the configuration of FIG. 5, the NAND gate ND10 outputs a low-level signal when both the signals input to the NAND gate ND10 have a high level. In response to the low-level signal from the NAND gate ND10, the PMOS P10 is turned on, thereby causing the global data bus line to be driven to a high level. As a result, the data GIO_DATA becomes high in level. Meanwhile, the NOR gate NR10 outputs a low-level signal in response to the data MA_DATA which has a high level, so that the NMOS transistor N10 is turned off. Accordingly, data GIO_DATA having a high level is transferred via the global data bus line. The data receiver 300 receives and outputs the high-level data GIO_DATA. in the semiconductor device according to the illustrated embodiment, however, the data transfer unit 200 performs the operation for driving the data GIO_DATA to a high level, only for a predetermined time, in order to prevent the data GIO_DATA from being fully swung to the level of an external voltage VDD. This will be described hereinafter.

Figure 6:
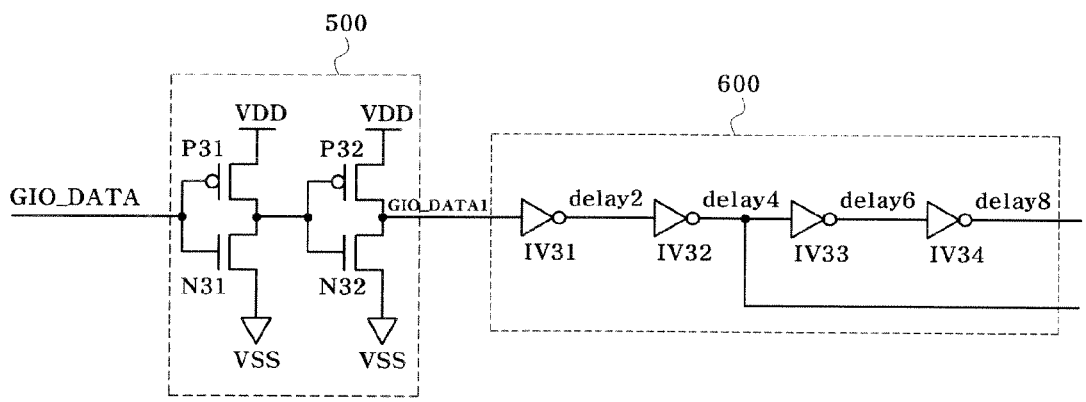
FIG. 6 is a circuit diagram illustrating configurations of a data sensor and a delay included in the semiconductor device according to the exemplary embodiment.

Referring to FIG. 6, a data sensor 500 is illustrated which includes an inverter type driver. The data sensor 500 receives data GIO_DATA having a high level, senses the level of the received data GIO_DATA, drives the data GIO_DATA to the level of the external voltage VDD, and outputs the resultant data, namely, data GIO_DATA1. The delay 600, which is constituted by an inverter chain including a plurality of inverters, outputs delay signals respectively obtained by delaying the high-level data GIO_DATA1 output from the data sensor 500 for predetermined delay periods, namely, the delay signals delay4 and delay8.

The delay signals delay4 and delay8 correspond to delayed data of the high-level data GIO_DATA1 for different delay periods in accordance with operation of the delay 600 constituted by an inverter chain, respectively. The delay signal delay4 is transited to a high level when a predetermined first delay period T1 elapses from transition of the data GIO_DATA to a high level. The delay signal delay8 is transited to a high level when a predetermined second delay period T2 elapses from transition of the data GIO_DATA to a high level (T1<T2). As shown in FIG. 7, the delay signals delay4 and delay8 are input to the delay controller 700, and are selectively used in accordance with whether or not the test mode signal TEST is in an enable state. The delay signal delay4 is used in a normal operation mode, whereas the delay signal delay8 is used in a test mode. That is, in the normal operation mode, the logic unit 710 outputs the delay signal delay4 because the test mode signal TEST enters a disable state, namely, a low level state. In this case, the logic unit 720 outputs a low-level signal irrespective of the delay signal delay8. On the other hand, in the test mode, the logic unit 720 outputs the delay signal delay8 because the test mode signal TEST enters an enable state, namely, a high level state. In this case, the logic unit 710 outputs a low-level signal irrespective of the delay signal delay4. Thus, in the illustrated embodiment, delay signals having different delay periods are used in normal and test modes, respectively. The following description will be described mainly in conjunction with the normal operation mode.

In the normal operation mode, in the configuration of FIG. 7, the logic unit 710 outputs the delay signal delay4, and the logic unit 720 outputs a low-level signal. Accordingly, the NOR gate NR21 outputs an inverted signal of the delay signal delay4, and the NOR gate NR22 re-inverts the inverted signal output from the NOR gate NR21, and outputs the resultant signal as the adjustment signal FEED_PU. Similarly, the NOR gate NR23 outputs an inverted signal of the delay signal delay4, and the NAND gate ND23 re-inverts the inverted signal output from the NOR gate NR23, and outputs the resultant signal as the adjustment signal FEED_PD. Since the delay signal delay4 is transited to a high level when the predetermined first delay period T1 elapses from the transition of the data GIO_DATA to a high level, as described above, the adjustment signal FEED_UP is also transited from a low level to a high level when a period approximately equal to the first delay period T1 elapses from the transition of the data GIO_DATA to a high level. However, the adjustment signal FEED_PD is maintained in the previous state thereof, namely, a high-level state.

Accordingly, when a period approximately equal to the first delay period T1 elapses from the transition of the data GIO_DATA to a high level, the PMOS transistor P41 in the first transfer control signal generator 810 of FIG. 8 is turned off in response to the data MA_DATA which has a high level. Also, the NAND gate ND51 outputs a low-level signal because both the signals respectively input to the input terminals of the NAND gate ND51 have a high level. Accordingly, the NMOS transistor N41 is turned on in response to a high-level signal output from the inverter IV52, so that the transfer control signal GIO_FEED_PU has a low level. On the other hand, in the second transfer control signal generator 820, the NOR gate NR51 outputs a low-level signal. Also, the PMOS transistor P42 is turned off in response to a high-level signal output from the inverter IV54, and the NMOS transistor N42 is turned on in response to the data MA_DATA which has a high level. Accordingly, the transfer control signal GIO_FEED_PD is maintained in a low level state.

Figure 1:
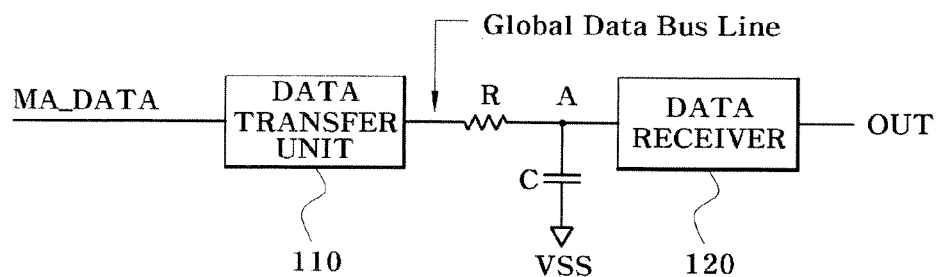
FIG. 1 is a circuit diagram explaining a conventional method for transferring data via a global data bus line in a semiconductor device.
Figure 2:
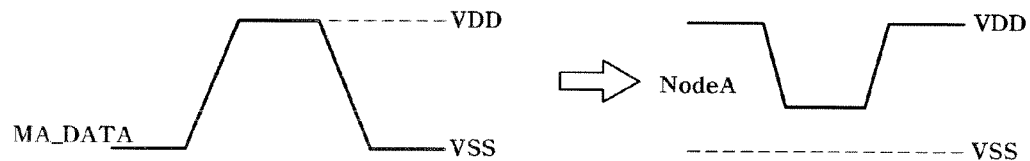
FIG. 2 is a waveform diagram illustrating a variation in the potential of data transferred in accordance with a conventional data transfer method.
Figure 3:
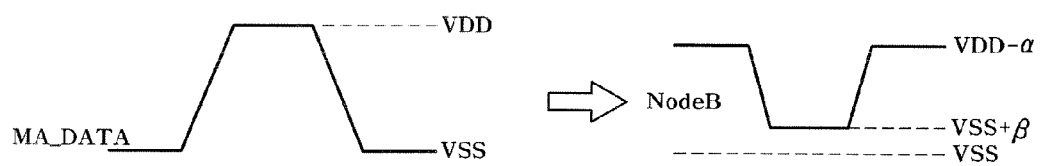
FIG. 3 is a waveform diagram illustrating a variation in the potential of data transferred in accordance with a data transfer method in a semiconductor device.

In the data transfer unit 200 of FIG. 5, the NAND gate ND10 receives the high-level data MA_DATA and the low-level transfer control signal GIO_FEED_PU, thereby outputting a high-level signal. In response to the high-level signal, the PMOS transistor P10 is turned off. Meanwhile, the NOR gate NR10 receives the high-level data MA_DATA and the low-level transfer control signal GIO_FEED_PD, thereby outputting a low-level signal. In response to the low-level signal, the NMOS transistor N10 is turned off. As apparent from the above description, in the illustrated embodiment, the data transfer unit 200 is turned off when a period approximately equal to the first delay period T1 elapses after the data MA_DATA is transited from a low level to a high level. Thus, the data transfer unit 200 stops the operation thereof before the data GIO_DATA placed on the global data bus line is fully driven up to the level of the external voltage VDD. Accordingly, the data on the global data bus line, in particular, the data GIO_DATA on a node B shown in FIG. 5. is driven to a level "VDD−α" lower than the level of the external voltage VDD without being swung to the level of the external voltage VDD, as shown in FIG. 3.

When the data MA_DATA is subsequently transited to a high level to a low level, the PMOS transistor P41 in the transfer controller 800 of FIG. 8 is turned on, and the NMOS transistor N41 is turned off. Accordingly, the transfer control signal GIO_FEED_PU is transited to a high level. At this time, the PMOS transistor P42 is maintained in an OFF state because the adjustment signal FEED_PD is still high in level. Also, the NMOS transistor N42 is turned off in response to the data MA_DATA which has a low level. However, the transfer control signal GIO_FEED_PD is maintained in a low-level state in accordance with the operation of the latch 821.

In the configuration of FIG. 5, the NOR gate NR10 receives the low-level data MA_DATA and the low-level transfer control signal GIO_FEED_PD, thereby outputting a high-level signal. In response to the high-level signal, the NMOS transistor N10 is turned on, thereby causing the global data bus line to be driven to a low level. As a result, the data GIO_DATA is transited to a low level. Meanwhile, the NAND gate ND10 outputs a high-level signal in response to the low-level data MA_DATA, so that the PMOS transistor P10 is turned off. Accordingly, data GIO_DATA having a low level is transferred via the global data bus line. The data receiver 300 receives and outputs the low-level data GIO_DATA. In the semiconductor device according to the illustrated embodiment of the present invention, however, the data transfer unit 200 performs the operation for driving the data GIO_DATA to a high level, only for a predetermined time, in order to prevent the data GIO_DATA from being fully swung to the level of a ground voltage VSS. This will be described hereinafter.

Referring to FIG. 6, the data sensor 500 receives data GIO_DATA having a low level, senses the level of the received data GIO_DATA, drives the data GIO_DATA to the level of the ground voltage VSS, and outputs the resultant data, namely, data GIO_DATA1. The delay 600 outputs delay signals respectively obtained by delaying the low-level data GIO_DATA1 output from the data sensor 500 for predetermined delay periods, namely, the delay signals delay4 and delay8.

As described above. the delay signals delay4 and delay8 correspond to delayed data of the high-level data GIO_DATA1 for different delay periods in accordance with operation of the delay 600 constituted by an inverter chain, respectively. The delay signal delay4 is transited to a low level when the predetermined first delay period T1 elapses from transition of the data GIO_DATA to a low level. The delay signal delay8 is transited to a low level when the predetermined second delay period T2 elapses from transition of the data GIO_DATA to a low level (T1<T2). As shown in FIG. 7, the delay signals delay4 and delay8 are input to the delay controller 700, and are selectively used in accordance with whether or not the test mode signal TEST is in an enable state. The delay signal delay4 is used in the normal operation mode, whereas the delay signal delay8 is used in the test mode.

Similarly to the above case, the following description will be described mainly in conjunction with the normal operation mode. In the normal operation mode, the logic unit 710 outputs the delay signal delay4 because the test mode signal TEST enters a disable state, namely, a low level state. In this case, the logic unit 720 outputs a low-level signal irrespective of the delay signal delay8. Accordingly, the NOR gate NR21 outputs an inverted signal of the delay signal delay4, and the NOR gate NR22 re-inverts the inverted signal output from the NOR gate NR21, and outputs the resultant signal as the adjustment signal FEED_PU. Similarly, the NOR gate NR23 outputs an inverted signal of the delay signal delay4, and the NAND gate ND23 re-inverts the inverted signal output from the NOR gate NR23, and outputs the resultant signal as the adjustment signal FEED_PD. Since the delay signal delay4 is transited to a low level when the predetermined first delay period T1 elapses from the transition of the data GIO_DATA to a high level, as described above, the adjustment signal FEED_UP is also transited from a high level to a low level when a period approximately equal to the first delay period T1 elapses from the transition of the data GIO_DATA to a low level. Similarly, the adjustment signal FEED_PD is transited from a high level to a low level after a period approximately equal to the first delay period T1 elapses from the transition of the data GIO_DATA to a low level.

Accordingly, when a period approximately equal to the first delay period T1 elapses from the transition of the data GIO_DATA to a low level, the NOR gate NR51 in the second transfer control signal generator 820 receives the low-level data MA_DATA and the low-level adjustment signal FEED_PD, thereby outputting a high-level signal. In response to a low-level signal output from the inverter IV54, the PMOS transistor P42 is turned on, and the NMOS transistor N42 is turned off in response to the low-level data MA_DATA. Accordingly, the transfer control signal GIO_FEED_PD is transited to a high level. On the other hand, in the first transfer control signal generator 810, the PMOS transistor P41 is maintained in an ON state, and the NMOS transistor N41 is maintained in an OFF state because the data MA_DATA has a low level. Accordingly, the transfer control signal GIO_FEED_PU is maintained in a high-level state.

In the data transfer unit 200 of FIG. 5, the NOR gate NR10 receives the low-level data MA_DATA and the high-level transfer control signal GIO_FEED_PD, thereby outputting a low-level signal. In response to the low-level signal, the NMOS transistor N10 is turned off. On the other hand, the NAND gate ND10 outputs a high-level signal because the low-level data MA_DATA is input to the NAND gate ND10. Accordingly, the PMOS transistor P10 is maintained in an OFF state. As apparent from the above description, in the illustrated embodiment, the data transfer unit 200 is turned off when a period approximately equal to the first delay period T1 elapses after the data MA_DATA is transited from a high level to a low level. Thus, the data transfer unit 200 stops the operation thereof before the data GIO_DATA placed on the global data bus line is fully driven to the level of the ground voltage VSS. Accordingly, the data on the global data bus line, in particular, the data GIO_DATA on a node B shown in FIG. 5, is driven to a level "VDD+β" higher than the level of the ground voltage VSS without being dropped to the level of the ground voltage VSS, as shown in FIG. 3.

In brief, in the semiconductor device according to the illustrated embodiment, the data transfer unit 200 stops the driving operation thereof before the data GIO_DATA placed on the global data bus line rises fully up to the level of the external voltage VDD as the data transfer unit 200 is turned off when a period approximately equal to the first delay period T1 elapses after the data MA_DATA is transited from a low level to a high level. Also, the data transfer unit 200 stops the driving operation thereof before the data GIO_DATA placed on the global data bus line falls fully to the level of the ground voltage VSS as the data transfer unit 200 is turned off when a period approximately equal to the first delay period T1 elapses after the data MA_DATA is transited from a high level to a low level. Thus, in accordance with the illustrated embodiment, the data GIO_DATA on the global data bus line is swung between the level "VDD−α" lower than the level of the external voltage VDD and the level "VSS+β" higher than the level of the ground voltage VSS, as shown in FIG. 3. Accordingly, it is possible to increase the data transfer rate in transferring the data output from the I/O sense amplifier via the global data bus line, and to obtain excellent operation characteristics even in a high-frequency operation environment. In addition, in accordance with the illustrated embodiment, the data GIO_DATA on the global data bus line is biased to neither the external voltage VDD nor the ground voltage VSS. Accordingly, the data receiver 300 can correctly sense the high or low level of data. Thus, generation of data errors is suppressed.

Although the above embodiment has been described mainly in conjunction with the normal operation mode, it is also possible to achieve an increase in data transfer rate in the test mode by reducing the swing width of the data GIO_DATA in accordance with the same operations as the above-described operations. Of course, there is a slight difference between the test mode and the normal operation mode in that the swing width of the data GIO_DATA in the test mode is slightly larger than that in the normal operation mode because the driving operation of the data transfer unit 200 is stopped after the delay period T2, which may be longer than the delay period T1 elapses. If necessary, the delay period T2 in the test mode may be shorter than the delay period T1 in the normal operation mode.

Meanwhile, although the delay controller 700 is used to select different delay periods in accordance with the normal operation mode and the test mode, respectively, in the illustrated embodiment, it may be possible to input a delay signal, generated in accordance with a delay operation of the delay 600 for a predetermined delay period, to the transfer controller 800, in place of the adjustment signals FEED_PU and FEED_PD as input in the illustrated embodiment. For example, it is possible to reduce the swing width of the data GIO_DATA placed on the global data bus line by inputting a signal, obtained by delaying the data GIO_DATA for a predetermined delay period T3 by the delay 600, to the transfer controller 800 together with the data MA_DATA, thereby stopping the driving operation of the data transfer unit 200 when the delay period T3 elapses from the level transition of the data GIO_DATA. In this case, the delay period T3 by the delay 600 may be varied depending on whether the semiconductor device is in the test mode or in the normal operation mode.

Although the described embodiments illustrate structures being applied to the I/O interface of a DRAM, they may be applied to I/O interfaces of other semiconductor devices, for example, a merged memory logic (MML).

As apparent from the above description, the semiconductor device may increase the data transfer rate in transferring data output from an input/output sense amplifier via a global data bus line by reducing the swing width of the data placed on the global data bus line, thereby achieving an enhancement in high-frequency operation characteristics.

Although the various exemplary embodiments have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
   a data transfer unit which receives first data, and outputs second data obtained by driving the first data to a predetermined level to a data transfer line;
   a data receiver which receives the second data transferred via the data transfer line;
   a delay which outputs a plurality of delay signals respectively obtained by delaying the second data outputted from the data transfer unit by different delay periods;
   a delay controller which selects one of the delay signals in accordance with an operation mode of the semiconductor device, and outputs at least one adjustment signal for adjusting a driving period of the data transfer unit for the first data based on the delay period of the selected delay signal; and
   a transfer controller which receives the first data and the at least one adjustment signal, and outputs at least one transfer control signal for controlling the operation of the data transfer unit, based on the received first data and adjustment signal.

2. The semiconductor device according to claim 1, wherein the data transfer unit includes:
   a first logic unit which logically operates a first one of the at least one transfer control signal and the first data, and outputs the result of the logical operation;
   a pull-up unit which pulls up an output terminal of the data transfer unit in response to an output signal from the first logic unit;
   a second logic unit which logically operates a second one of the at least one transfer control signal and the first data, and outputs the result of the logical operation; and
   a pull-down unit which pulls down the output terminal of the data transfer unit in response to an output signal from the second logic unit.

3. The semiconductor device according to claim 2, wherein the first logic unit executes a NANDing operation, and the second logic unit executes a NORing operation.

4. The semiconductor device according to claim 1, wherein the data receiver includes at least one driver which drives the second data to a predetermined level, and outputs the resultant data.

5. The semiconductor device according to claim 1, further comprising:
   a data sensor which senses a level of the second data output from the data transfer unit, drives the second data to a predetermined level, based on the sensed second data level, and supplies the result of the driving to the delay.

6. The semiconductor device according to claim 5, wherein the data sensor includes a plurality of buffers which buffer the second data.

7. The semiconductor device according to claim 1, wherein the delay controller includes:
   a first logic unit which logically operates a first one of the delay signals and an inverted signal of an operation mode signal representing an operation mode of the semiconductor device, and outputs the result of the logical operation;
   a second logic unit which logically operates a second one of the delay signals and the operation mode signal, and outputs the result of the logical operation;
   a third logic unit which logically operates an output signal from the first logic unit and an output signal from the second logic unit; and
   a fourth logic unit which logically operates the output signal from the first logic unit and the output signal from the second logic unit.

8. The semiconductor device according to claim 7, wherein the delay controller further includes:
   a fifth logic unit which logically operates an output signal from the third logic unit and a reset signal, and outputs the result of the logical operation as a first one of the at least one adjustment signal; and
   a sixth logic unit which logically operates an output signal from the fourth logic unit and an inverted signal of the reset signal, and outputs the result of the logical operation as a second one of the at least one adjustment signal.

9. The semiconductor device according to claim 8, wherein the fifth logic unit executes a NORing operation, and the sixth logic unit executes a NANDing operation.

10. The semiconductor device according to claim 7, wherein each of the first and second logic units executes an ANDing operation.

11. The semiconductor device according to claim 10, wherein each of the third and fourth logic units executes a NANDing operation.

12. The semiconductor device according to claim 7, wherein the operation mode signal is used to determine whether the semiconductor device in a normal operation mode or in a test mode.

13. The semiconductor device according to claim 1, wherein the transfer controller includes:
   a first transfer control signal generator which includes a first pull-up unit for pulling up a first node in response to the first data, a first logic unit for logically operating a first one of the at least one adjustment signal and the first data, a first buffer for buffering an output signal from the first logic unit, and a first pull-down unit for pulling down the first node in response to an output signal from the first buffer.

14. The semiconductor device according to claim 13, wherein the first logic unit executes a NANDing operation.

15. The semiconductor device according to claim 13, wherein the first transfer control signal generator further includes a latch for latching a signal on the first node for a predetermined period.

16. The semiconductor device according to claim 13, wherein the transfer controller further includes:
a second transfer control signal generator which includes a second logic unit for logically operating a second one of the at least one adjustment signal and the first data, a second buffer for buffering an output signal from the second logic unit, a second pull-up unit for pulling up a second node in response to an output signal from the second buffer, and a second pull-down unit for pulling down the second node in response to the first data.

17. The semiconductor device according to claim 16, wherein the second logic unit executes a NORing operation.

18. The semiconductor device according to claim 17, wherein the second transfer control signal generator further includes a latch for latching a signal on the second node for a predetermined period.

19. The semiconductor device according to claim 1, wherein the delay controller selects one of the delay signals in accordance with whether the semiconductor device is in a normal operation mode or in a test mode.

20. The semiconductor device according to claim 1, wherein the first data is a signal output from an input/output sense amplifier.

21. The semiconductor device according to claim 1, wherein the data transfer line is a global data bus line.

22. A semiconductor device comprising:
a data transfer unit which receives first data, and outputs second data obtained by driving the first data to a predetermined level to a data transfer line;
a data receiver which receives the second data transferred via the data transfer line;
a delay which outputs a delay signal obtained by delaying the second data outputted from the data transfer unit by a predetermined delay period;
a delay controller which receives the first data and the delay signal from the delay, and outputs a first transfer control signal and a second transfer control signal for controlling the data transfer unit to adjust a driving period of the first data in accordance with the delay period of the delay signal.

23. The semiconductor device according to claim 22, wherein the data transfer unit includes:
a first logic unit which logically operates the first data and the first transfer control signal, and outputs the result of the logical operation;
a pull-up unit which pulls up an output terminal of the data transfer unit in response to an output signal from the first logic unit;
a second logic unit which logically operates the first data and the second transfer control signal, and outputs the result of the logical operation; and
a pull-down unit which pulls down the output terminal of the data transfer unit in response to an output signal from the second logic unit.

24. The semiconductor device according to claim 23, wherein the first logic unit executes a NANDing operation, and the second logic unit executes a NORing operation.

25. The semiconductor device according to claim 22, further comprising:
a data sensor which senses a level of the second data output from the data transfer unit, drives the second data to a predetermined level, based on the sensed second data level, and supplies the result of the driving to the delay.

26. The semiconductor device according to claim 25, wherein the data sensor includes a plurality of buffers which buffer the second data.

27. The semiconductor device according to claim 22, wherein the predetermined delay period of the delay is set by different delay periods for a normal operation mode of the semiconductor device and a test mode of the semiconductor device, respectively.

28. The semiconductor device according to claim 22, wherein the transfer controller includes:
a first transfer control signal generator which includes a first pull-up unit for pulling up a first node in response to the first data, a first logic unit for logically operating the first data and the delay signal from the delay, a first buffer for buffering an output signal from the first logic unit, and a first pull-down unit for pulling down the first node in response to an output signal from the first buffer.

29. The semiconductor device according to claim 28, wherein the first logic unit executes a NANDing operation.

30. The semiconductor device according to claim 28, wherein the first transfer control signal generator further includes a latch for latching a signal on the first node for a predetermined period.

31. the semiconductor device according to claim 28, wherein the transfer controller further includes:
a second transfer control signal generator which includes a second logic unit for logically operating the first data and the delay signal from the delay, a second buffer for buffering an output signal from the second logic unit, a second pull-up unit for pulling up a second node in response to an output signal from the second buffer, and a second pull-down unit for pulling down the second node in response to the first data.

32. The semiconductor device according to claim 31, wherein the second logic unit executes a NORing operation.

33. The semiconductor device according to claim 31, wherein the second transfer control signal generator further includes a latch for latching a signal on the second node for a predetermined period.

34. The semiconductor device according to claim 22, wherein the first data is a signal output from an input/output sense amplifier, and the data transfer line is a global data bus line.

* * * * *